United States Patent [19]

Kadonome et al.

[11] Patent Number: 5,571,338
[45] Date of Patent: Nov. 5, 1996

[54] PHOTOVOLTAIC MODULE AND A PHOTOVOLTAIC APPARATUS

[75] Inventors: Nobuo Kadonome; Takayoshi Yasuda, both of Kyogo; Jyunji Kumamoto, Toyooka; Nobuyuki Nishi, Sumoto; Yasuo Kishi, Hirakata, all of Japan

[73] Assignee: Sanyo Electric Co., Ltd., Osaka, Japan

[21] Appl. No.: 344,922

[22] Filed: Nov. 25, 1994

[30] Foreign Application Priority Data

Nov. 26, 1993 [JP] Japan ................................. 5-296712
Aug. 30, 1994 [JP] Japan ................................. 6-205316

[51] Int. Cl.$^6$ .......................... H01L 31/048; E04D 13/18
[52] U.S. Cl. .......................... 136/251; 136/291; 52/173.3
[58] Field of Search .......................... 136/251, 291; 52/173.3

[56] References Cited

U.S. PATENT DOCUMENTS

| | | | |
|---|---|---|---|
| 4,336,413 | 6/1982 | Tourneux | 136/251 |
| 4,636,577 | 1/1987 | Peterpaul | 136/206 |
| 4,936,063 | 6/1990 | Humphrey | 52/200 |
| 5,125,983 | 6/1992 | Cummings | 136/246 |
| 5,164,020 | 11/1992 | Wagner et al. | 136/251 |
| 5,409,549 | 4/1995 | Mori | 136/251 |

FOREIGN PATENT DOCUMENTS

| | | | |
|---|---|---|---|
| 59-175169 | 10/1984 | Japan | 136/251 |
| 2-65362 | 5/1990 | Japan | 136/244 |
| 5-239895 | 9/1993 | Japan | 136/244 |

*Primary Examiner*—Aaron Weisstuch
*Attorney, Agent, or Firm*—Loeb & Loeb LLP

[57] ABSTRACT

A photovoltaic module comprises a photovoltaic panel having a top edge and a bottom edge. An exterior frame structure attached to edges of the photovoltaic panel defines an upwardly open groove extending along at least the top and bottom edges of the panel to direct rain water away from underside of the panel.

17 Claims, 20 Drawing Sheets

PHOTOVOLTAIC MODULE AND A PHOTOVOLTAIC APPARATUS

FIELD OF THE INVENTION

The present invention relates generally to a photovoltaic apparatus which is mounted upon a sloped surface of a roof of a building or the like.

BACKGROUND OF THE INVENTION

Japanese Patent Laid-Open No. HEI 5-239895 describes a structure in which a photovoltaic apparatus is mounted upon the sheathing of a sloped roof. The photovoltaic apparatus of this reference comprises a plurality of photovoltaic panels which are connected together at their peripheries with sealing joints. The sealing joints are intended to prevent rain water from leaking between the photovoltaic panels. However, because rain water nevertheless often leaks through the joints, weather damage to the underlying roof structure can occur.

Japanese Utility Model Laid-open No. HEI 2-65362 discusses another photovoltaic structure in which photovoltaic panels 2 are mounted on mounting bases 1 in an overlapping fashion on the roof, as shown in FIGS. 1 and 2. Each of the mounting bases 1 has a central groove and step-like portions 1A on both sides of the central groove to support the overlapping photovoltaic panels 2. The step-like portions 1A have receiving electrical connectors 3 to interconnect the photovoltaic panels 2.

In the structure of this photovoltaic apparatus, the photovoltaic panels are partially overlapped like roofing tiles in order to direct rain water over the photovoltaic panels. As a result, the size of each photovoltaic panel is increased to permit them to overlap. In a roofing tile made of a low-priced material, an increase in size does not substantially increase the cost. However, since a photovoltaic panel is typically made of a relatively expensive material, an increase in size can result in a substantially higher cost.

In addition, the photovoltaic panels of this mounting structure are typically installed from the bottom panel up so as to facilitate overlapping the panels. To securely fix the photovoltaic panels on the mounting base, the photovoltaic panels are typically fastened with nails which penetrate through the overlapping portions of the photovoltaic panels. One disadvantage of nail fasteners is that the nails frequently break the photovoltaic panels. In addition, it is often very difficult to replace a broken photovoltaic panel with a new one, because the photovoltaic panels are nailed together in an overlapping structure.

U.S. Pat. No. 4,336,413 describes another photovoltaic apparatus having an overlapping interconnecting structure which, as shown in FIGS. 3 and 4, includes an exterior frame 5 fixed on the periphery of each photovoltaic panel 4. The exterior frame 5 has a downwardly opening groove 5A along the bottom edge of a photovoltaic panel 4, and an upwardly opening groove 5B along the top edge of the photovoltaic panel 4. Further, as shown in FIG. 4, the exterior frame 5 has another upwardly opening groove 5B along one side edge of photovoltaic panel 4, and another downwardly opening groove 5A along the other side edge of photovoltaic panel 4. As shown in FIG. 3, each upwardly opening groove 5B of the panel 4 is received by the downwardly opening groove 5A of an adjacent frame 5 of the adjacent panel. While the structure of this photovoltaic apparatus can reduce the amount of rain water leaking around the boundary between the photovoltaic panels, it is very difficult to replace a broken or damaged photovoltaic panel.

Photovoltaic panels are typically relatively fragile, and as such, are easily damaged. Therefore it would be very advantageous if damaged or broken panel could be readily replaced. For example, breakage can occur when an object blown by a strong wind strikes one or more of the photovoltaic panels. In other instances, tools may be inadvertently dropped on the photovoltaic panels during installation of the photovoltaic panels. Furthermore, people may step on the photovoltaic panels when setting up a TV antenna on the roof. Also, the panels may malfunction, particularly after a prolonged period of time. For example, the photovoltaic panels may not work properly due to degradation of the semiconductor devices in one or more of the photovoltaic panels.

When one photovoltaic panel is broken or malfunctions, the overall output from a photovoltaic apparatus can drop substantially. In a photovoltaic apparatus, the photovoltaic panels are usually connected in series to provide a particular output voltage required for the application. For example, one application may utilize six photovoltaic panels connected in series. If one photovoltaic panel breaks, the output of the entire photovoltaic apparatus can be disabled, even though the other five photovoltaic panels are in good working condition. Therefore, it is very important that a broken or malfunctioning photovoltaic panel in a photovoltaic apparatus be readily replaced with a new one.

SUMMARY OF THE INVENTION

It is an object of the present invention to provide a photovoltaic apparatus having increased weather resistance for preventing rain water from leaking in the roof.

It is another object of the present invention to provide a photovoltaic apparatus which facilitates the maintenance and repair of the photovoltaic apparatus.

These and other objects are achieved by, in accordance with one embodiment of the present invention, a photovoltaic apparatus comprising a generally rectangular photovoltaic panel and an exterior frame structure which includes upwardly opening channels which extend along at least the top and bottom peripheral edges of the photovoltaic panel. Such an arrangement has been found to effectively prevent rain water from leaking between the panels yet readily facilitate replacement of panels as needed.

In one embodiment, a plurality of photovoltaic modules may be mounted side by side on a lengthwise channel member which is placed on a sloped surface, such as for example, on a roof. The exterior frame structure of the photovoltaic module is designed so that, when a plurality of photovoltaic modules are arranged side by side, the rain water outlets of the upwardly opening channels communicate with the lengthwise channel member. As a result, rain water caught by the upwardly open channels is directed into the lengthwise channel and is substantially prevented from leaking at the joints of adjacent photovoltaic modules to the rear side of the photovoltaic modules. Furthermore, since adjacent photovoltaic modules are arranged side by side without overlapping each other, replacement of photovoltaic modules is made relatively easier.

DETAILED DESCRIPTION OF THE PREFERRED EMBODIMENTS

A first embodiment of the Present invention will be described with reference to FIGS. 5–9. As will be explained in greater detail below, the photovoltaic apparatus of the illustrated embodiment includes an exterior frame structure having upwardly opening channels which extend along at least the top and bottom peripheral edges of each photovoltaic panel. Such an arrangement has been found to effectively prevent rain water from leaking between the panels without the necessity for overlapping the panels or the frame structures. In addition, the adjacent frame structures are readily secured together during initial installation and are also readily detached to facilitate replacing individual panels as needed.

Figure 1:
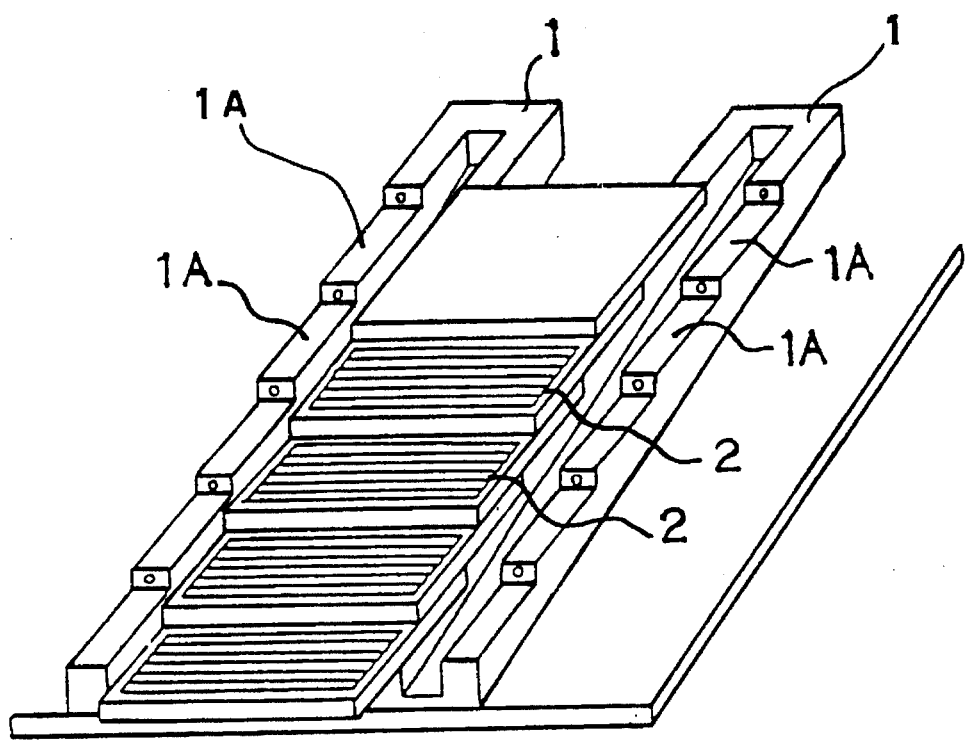
FIG. 1 is a perspective view of a prior art photovoltaic apparatus.
Figure 2:
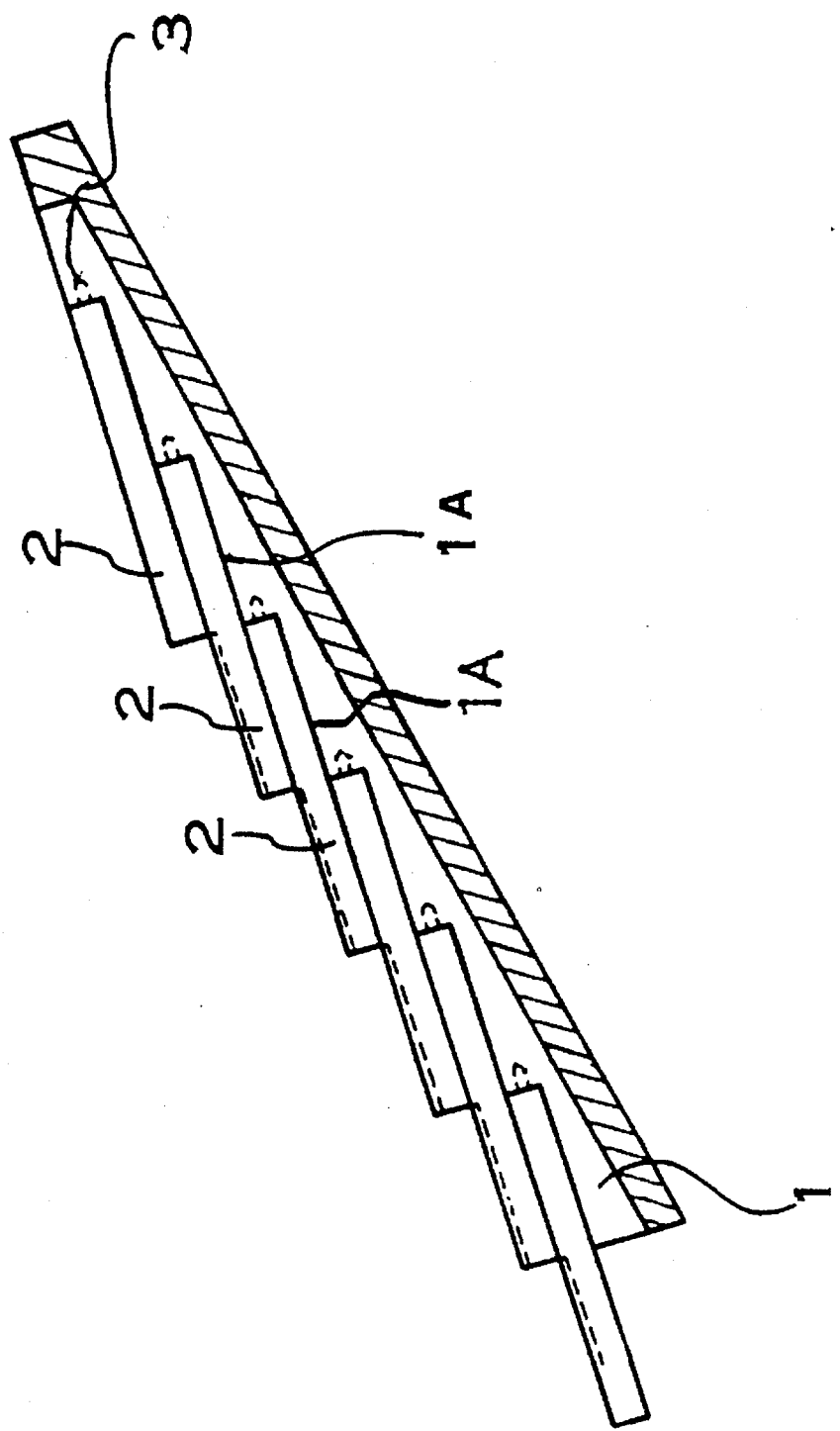
FIG. 2 is a cross-sectional view of the apparatus of FIG. 1.
Figure 3:
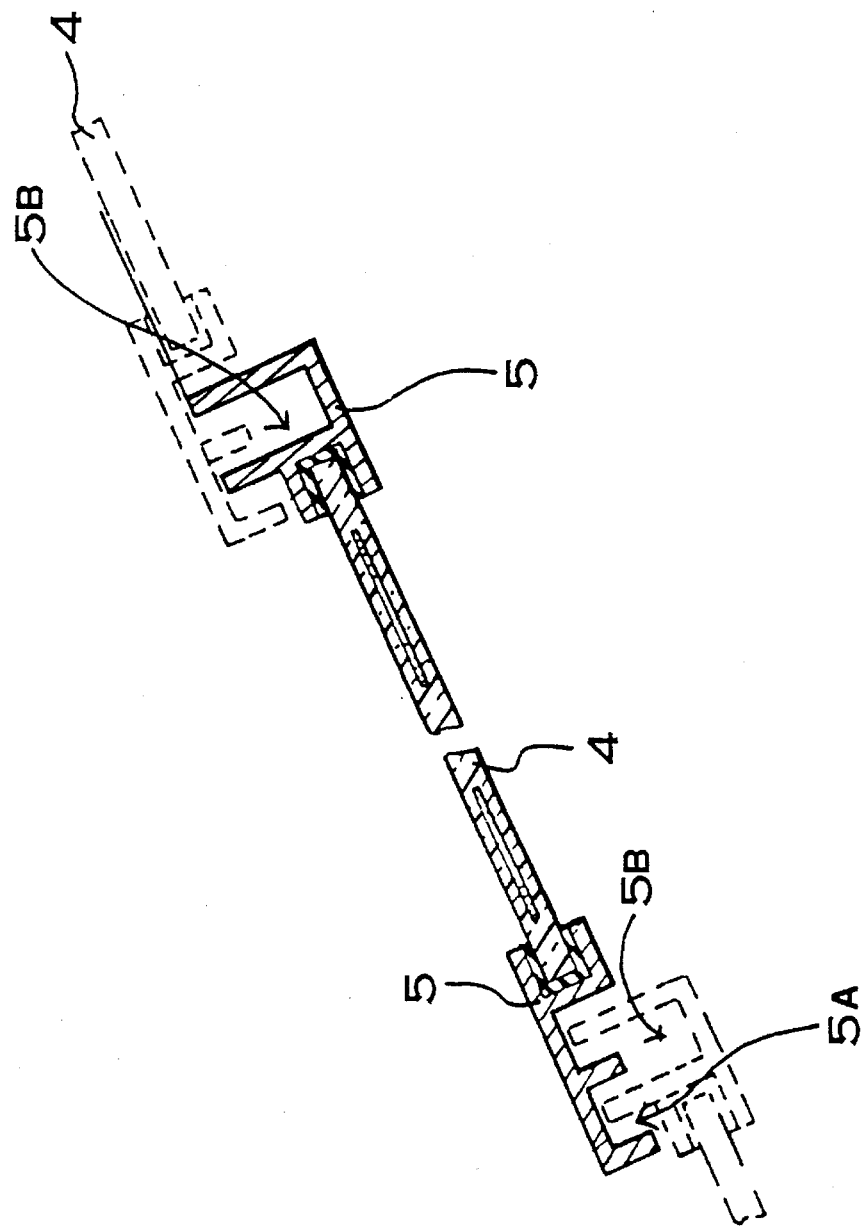
FIG. 3 is a cross-sectional view of another prior art photovoltaic apparatus.
Figure 4:
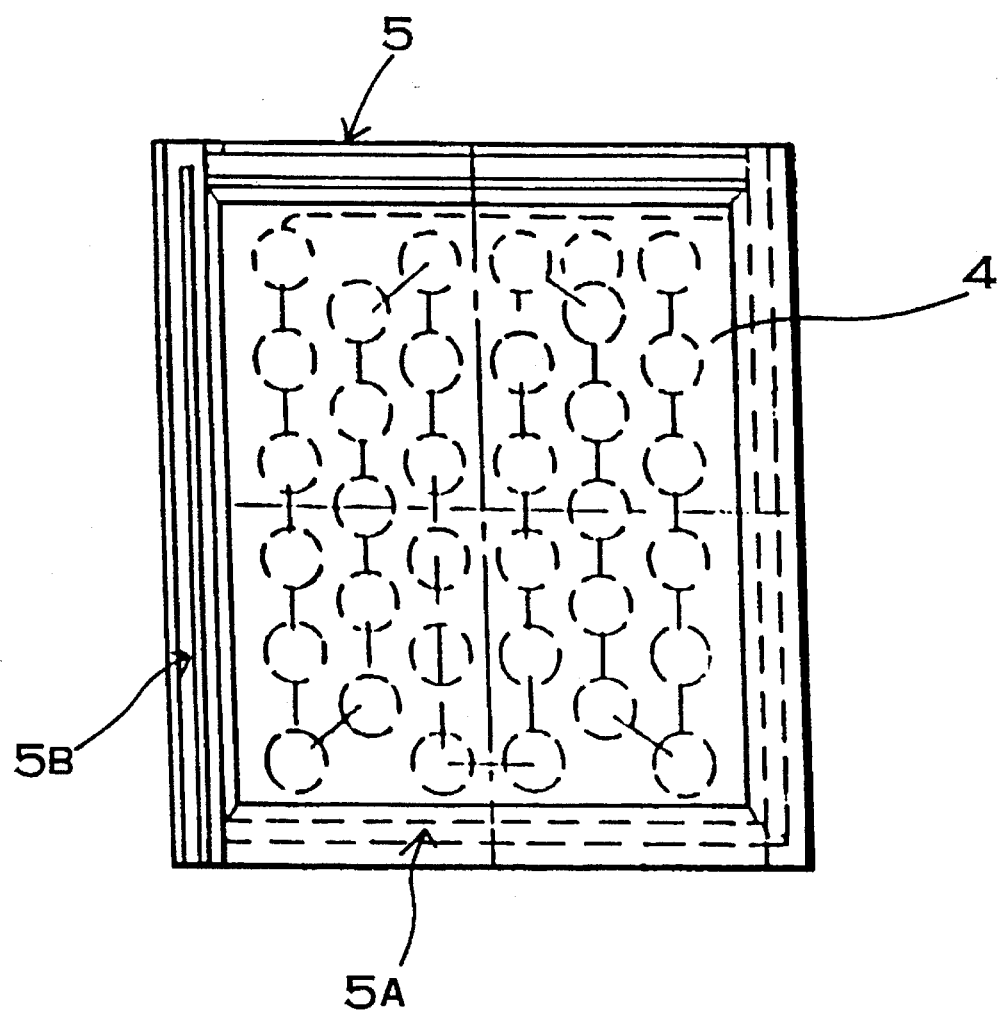
FIG. 4 is a plan view of one module of the apparatus of FIG. 3.
Figure 5:
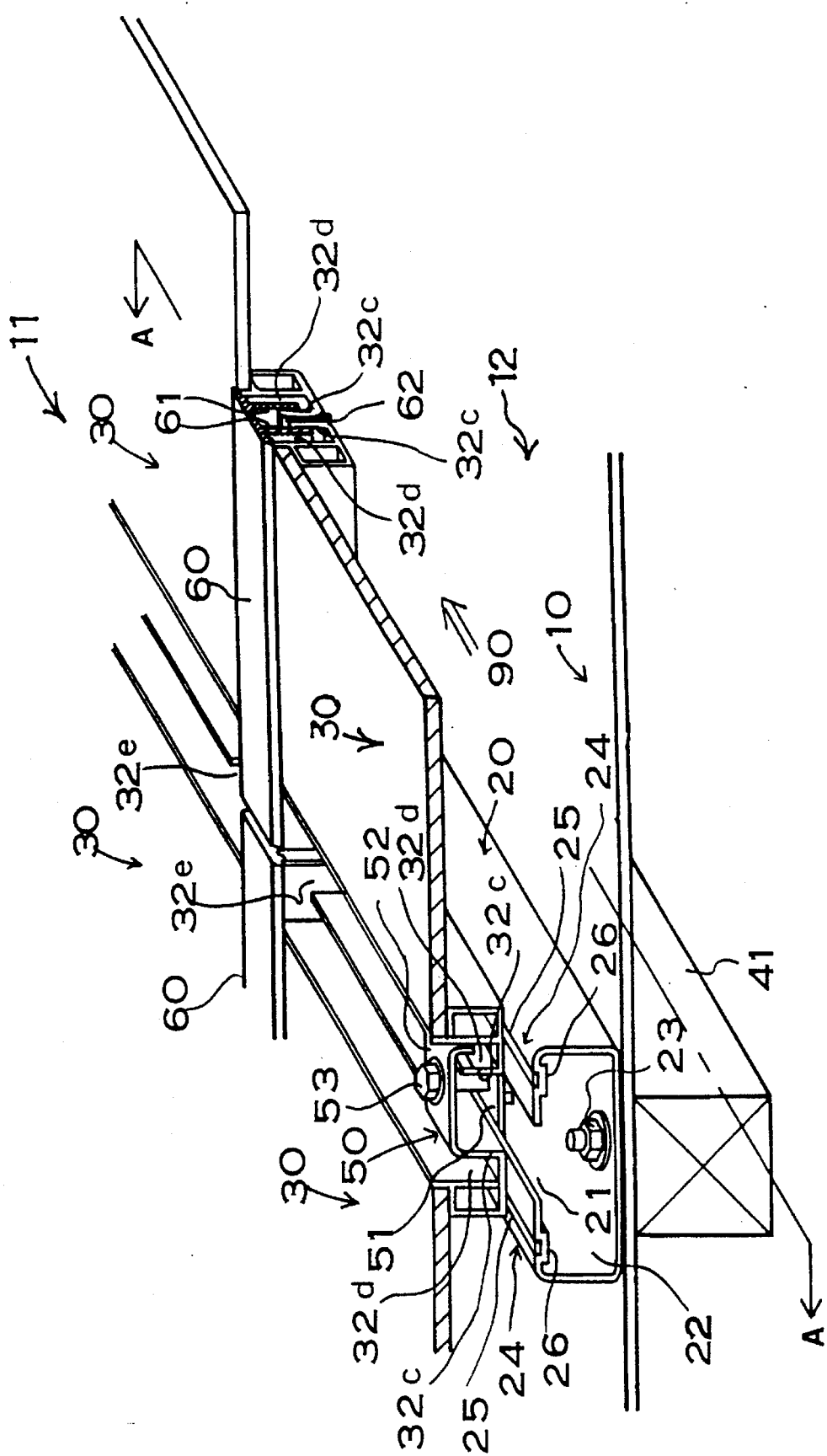
FIG. 5 is a perspective view an apparatus in accordance with one embodiment of the present invention having a partially broken away cross-sectional view.
Figure 6:
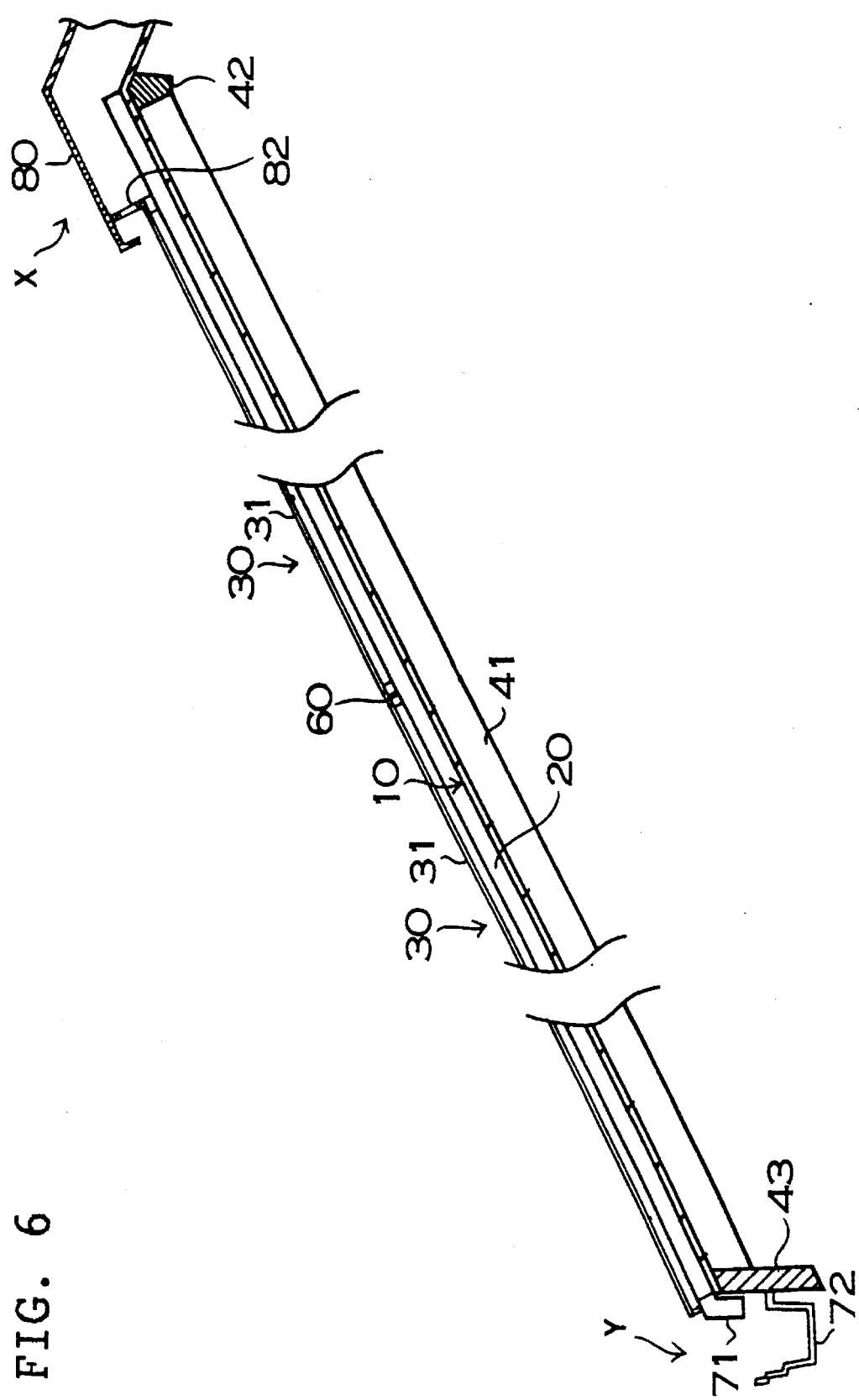
FIG. 6 is a cross-sectional view taken along the line A—A of FIG. 5.

As shown in FIGS. 5 and 6, a photovoltaic apparatus in accordance with one embodiment of the present invention is indicated generally at 11. In a preferred embodiment, the photovoltaic apparatus 11 is directly mounted on the sheathing 10 of a sloping roof 12. It should be appreciated that the photovoltaic apparatus 11 may be placed directly on the top surface of the roof or on any surface. However, sloped surfaces are preferred.

The photovoltaic apparatus 11 has a plurality of photovoltaic modules 30 mounted on a lengthwise member 20 which extends in the direction of the slope of the roof 12. To cover all or a substantial portion of the roof 12, the photovoltaic apparatus 11 may require a plurality of lengthwise members 20 to support the photovoltaic modules 30. As shown in FIG. 6, each member 20 is preferably located along a roof rafter 41 which extends between a ridgepole 42 in a ridge area X and a fascia 43 in an eaves area Y. The roof sheathing 10 is affixed to the roof rafter 41 by nails.

Figure 7:
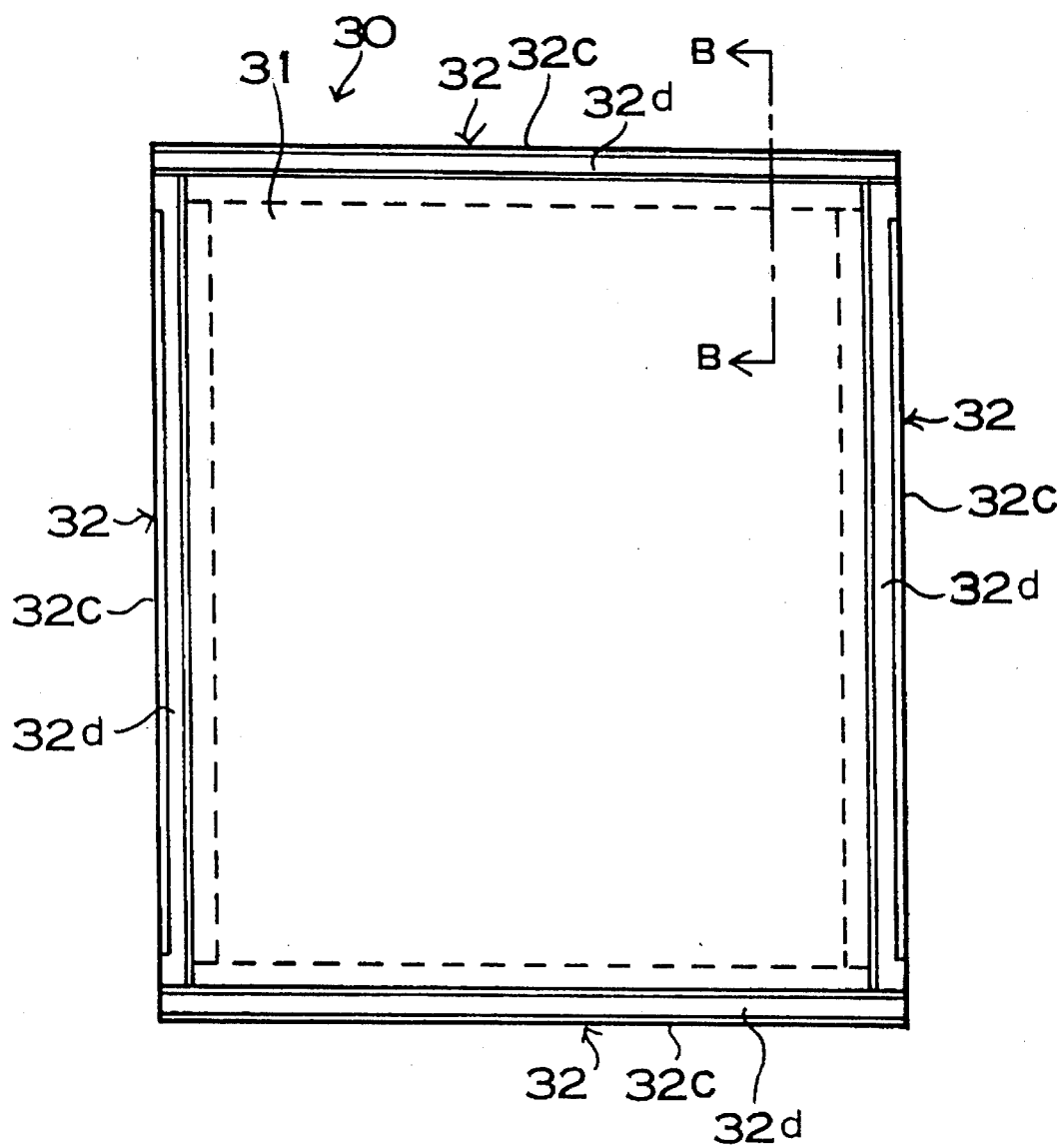
FIG. 7 is a plan view of one module of the apparatus of FIG. 5.
Figure 8:
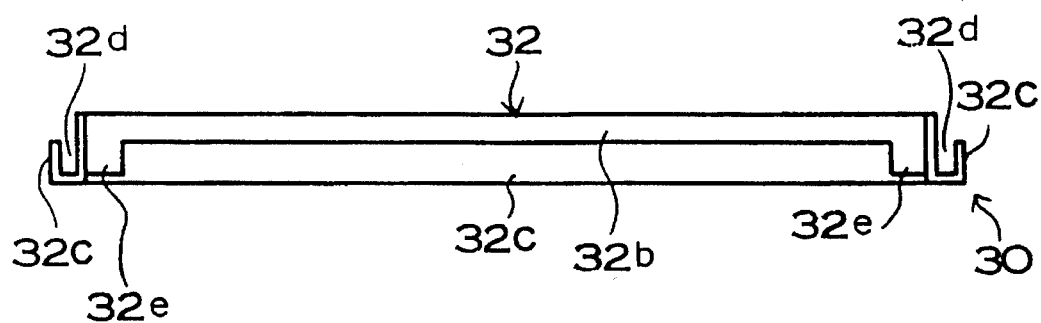
FIG. 8 is a side view of the module of FIG. 7.
Figure 9:
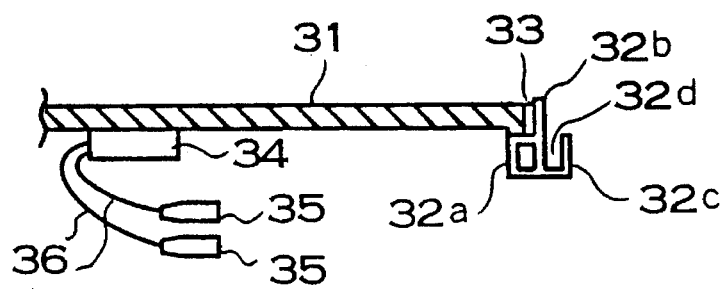
FIG. 9 is a cross-sectional view of a portion of the module of FIG. 7 taken along line B—B of FIG. 7.

As best shown in FIGS. 7–9, the photovoltaic module 30 comprises a photovoltaic panel 31 which is formed into a rectangular sheet configuration. Typically, each photovoltaic panel 31 includes a plurality of photovoltaic cells which are placed between a sheet of transparent tempered glass (not shown) and a sheet of film at the back. A gap between the two sheets (in which the photovoltaic cells are inserted) may be filled with a transparent resin (not shown).

The photovoltaic module 30 includes four exterior frame structures 32 which are fitted to the four sides of the panel along the top edge, the bottom edge and the two side edges of the photovoltaic panel 31, as shown in FIG. 7. The exterior frame structures 32 are made from an appropriate weather resistant material, such as, for example, aluminum alloy.

The exterior frame structures 32 each include a main frame member 32a. In accordance with one embodiment of the present invention, the main frame member 32a is formed from a pipe having a rectangular cross-section to provide a greater structural rigidity, as best shown in FIG. 9. An upper flange portion 32b upwardly extends from the upper surface of each main frame member 32a adjacent the periphery of the photovoltaic panel 31. The peripheral portion of the photovoltaic panel 31 is supported by the upper surfaces of the main frame members 32a inside the upper flange portions 32b of the four frame structures 32. A filler 33 fills the gap between the upper flange portion 32b and the peripheral edge of the photovoltaic panel 31 to seal the gap. The filler 33 is made of a suitable sealing material, such as, for example, urethane resin, polyvinyl chloride, and silicone resin.

Side flange portions 32c outwardly extend from the side surfaces of the main frame members 32a. In the illustrated embodiment, the side flange portions 32c are each formed from an L-shaped channel member to define upwardly open grooves 32d for receiving and channeling rain water flowing over the panels. As explained in greater detail below, both ends of the upwardly open grooves 32d along the top edge and the bottom edge are open at the side to transfer rain water to the lengthwise member 20. The side flange portions 32c being L-shaped along both side edges have openings 32e at both ends of the side surfaces thereof, also for the purpose of directing rain water to the lengthwise member 20.

A terminal box 34 may be located on the back of the panel 31 to receive the panel output. Connectors 35 connect the ends of lead wires 36 from the terminal box 34.

As shown in FIG. 5, the lengthwise member 20 has a rectangular cross section, and a top opening 21 on its upper side to thereby define an interior groove 22 along its length. The lengthwise member 20 is fixed by anchor bolt 23 to the roof sheathing 44 and the roof rafter 41.

As shown in FIG. 6, in the ridge area Y, a joint tube 71 is connected to the downstream end of the lengthwise member 20. The joint tube 71 has a rectangular cross section and is bent vertically toward a trough 72 fixed to the fascia 43 under the joint tube 71. In the ridge area X, a ridge cover 80 covers the upper end of the lengthwise member 20, and has a ventilating hole 82 on the side surface thereof.

The lengthwise member 20 has mounting flanges 24 (FIG. 5) on both sides of the top opening 21 to mount thereon the main frame members 32a and the side flange portion 32c of the exterior frame structures 32. Seal 25 is provided between the lengthwise member 20 and the exterior frame structures 32 to prevent the leakage of rain water. The seal 25 is made with a suitable sealing material, such as, for example, rubber, and may be inserted into grooves 26 formed in the mounting flanges 24.

A metal fixture 50 clamps the photovoltaic modules 30 to the lengthwise member 20. By the metal fixture 50, the side flange portions 32c facing the lengthwise member 20 are mounted on the mounting flanges 24 parallel to each other. Therefore the openings 32e face and communicate with the top opening 21. The seals 25 prevent rain water from leaking to the rear side of the photovoltaic modules 30.

The metal fixture 50 comprises a strip-shaped member 51, a U-shaped member 52 and a bolt and nut 53. The U-shaped member 52 is wider than the width of the top opening 21 and engages the interior surfaces of the mounting flanges 24. The U-shaped member 52 has a U-shaped cross section wherein both edges thereof engage the side flange portions 32c of the exterior frame structures 32. Members 51 and 52 are coupled and tightened to clamp the photovoltaic modules 30 to the lengthwise member 20.

Push-in members 60 cover gaps between the adjacent photovoltaic modules 30 in the sloped direction. The push-in members 60 may preferably be made of vinyl chloride, polycarbonate, aluminum or the like. Each push-in member 60 has a pair of resilient sandwiching elements 61 which sandwich two adjacent side flange portions 32c of the adjacent photovoltaic modules 30. In order to easily insert and detach, the push-in members 60 are preferably inserted without additional sealing material.

A seal 62 is inserted between the side flange portions 32c of the adjacent photovoltaic modules 30 in the sloped direction, and is made of a suitable sealing material, such as, for example, rubber. The seal 62 prevents rain water from leaking between the adjacent photovoltaic modules.

As a result of the above mentioned structure, a ventilating space 90 is formed under the photovoltaic modules 30. Furthermore, the lead wires 36 and the connectors 35 (as shown in FIG. 9) are disposed and connected electrically in the ventilating space 90.

As a result of the above structure including the metal fixture 50, the photovoltaic modules 30 are readily fixed on the mounting flanges 24 on the lengthwise member 20. When, for example, one of photovoltaic modules is broken, the push-in members 60 are removed and the metal fixture 50 is loosened. As a result, the broken module can be readily replaced with a new one.

Rain water flowing down the photovoltaic modules 30 in the direction of the slope encounters the push-in members 60. A portion of the rain water flows along the lengthwise direction of the push-in members 60, and falls into the upwardly open grooves 32d along both side edges of the photovoltaic modules 30. That rain water flows into the groove 22 of the lengthwise element 20 through the openings 32e, and finally reaches the trough 72.

As mentioned above, the push-in members 60 are not sealingly fixed. As a result, a portion of the rain water may reach the upwardly open grooves 32d in the top and bottom edges of the photovoltaic modules 30. However, both ends of the upwardly open grooves 32d in the top and bottom edges communicate with the groove 22 of the lengthwise member 20. As a result, rain water in the upwardly open grooves 32d flows into the groove 22, and therefore does not reach the roof sheathing 10.

In addition, ascending air passes through the ventilating space 90 which extends in the direction of the slope and is exhausted through the ventilating hole 82 of the ridge cover 80. As a result, the heat generated by the photovoltaic modules 30 is effectively ventilated to thereby prevent overheating. The ascending air also reduces or eliminates humidity in the ventilating space 90. As a result, the life of the building materials may be extended.

In addition, since the lead wires 36 and the connectors 35 are disposed in the ventilating space 90 and therefore are not exposed to the rain and wind, the durability of the lead wires 36 and connector 35 is increased.

Another embodiment of the present invention will be described with reference to FIGS. 10–21.

Figure 10:
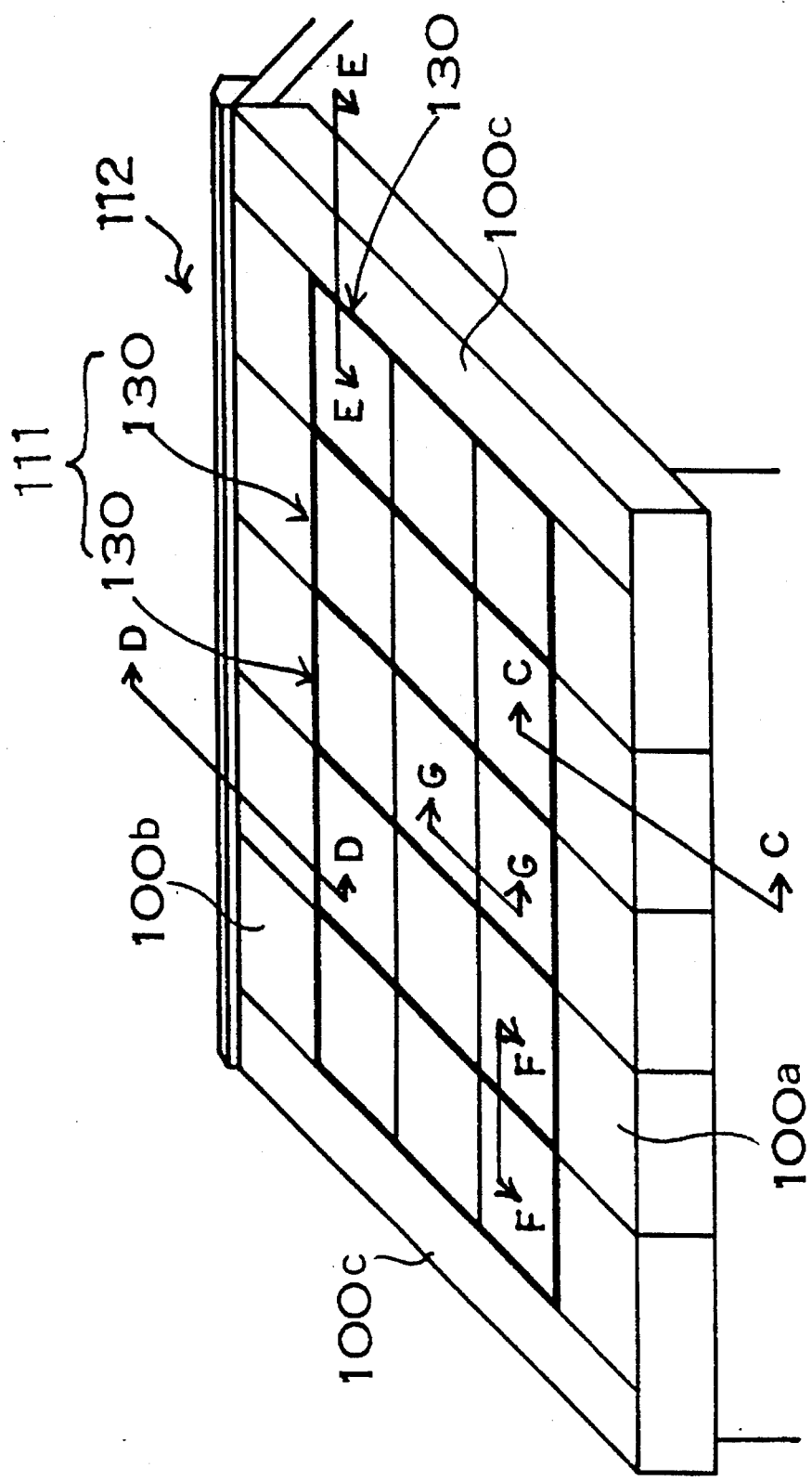
FIG. 10 is a perspective view of an apparatus in accordance with another embodiment of the present invention.

As shown in FIG. 10, a photovoltaic apparatus in accordance with another embodiment of the present invention is generally indicated at 111. In a preferred embodiment, the photovoltaic apparatus 111 is mounted on a roof 112 which is sloped. It should be appreciated that the photovoltaic apparatus 111 may be placed directly on any surface but preferably on a sloped surface.

In the illustrated embodiment, the photovoltaic apparatus 111 comprises fifteen photovoltaic modules 130 mounted on the roof 112, and waterproofing color boards 100a, 100b, 100c made of a suitable materials, such as, for example, steel and aluminum alloy. The waterproofing color boards 100a, 100b, 100c are mounted in the eaves area, the ridge area, and the verge areas, respectively on both sides. The color boards 100a, 100b, 100c may be made in a similar color or a similar pattern as the photovoltaic modules 130. Preferably, the waterproofing color boards may be of a similar size as the photovoltaic module.

Figure 11:
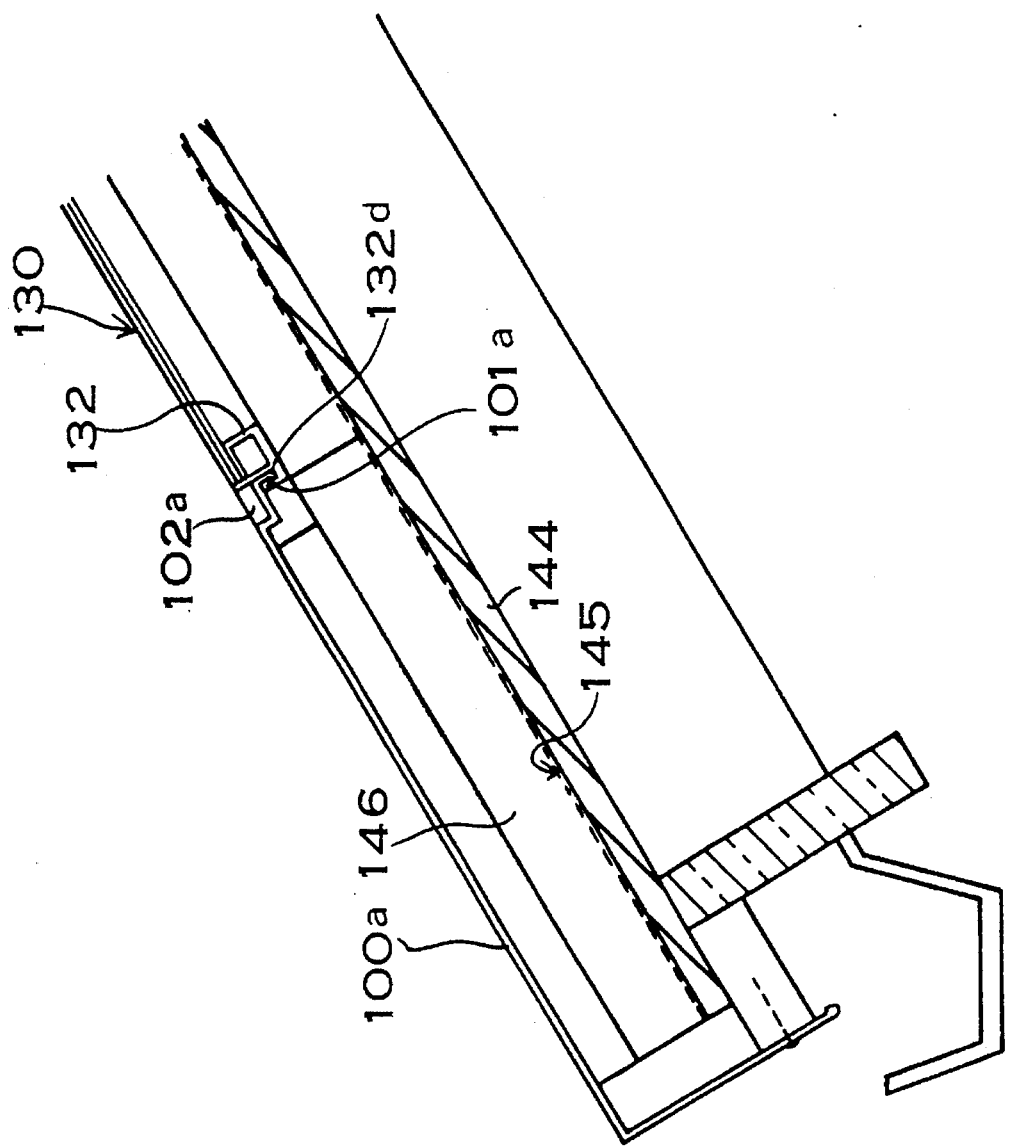
FIG. 11 is a cross-sectional view of the apparatus of FIG. 10 taken along the line C—C of FIG. 10.

FIG. 11 shows a cross section of the waterproofing color board 100a in the eaves area. The waterproofing color board 100a has a hook portion 101a in the top edge thereof which bends downwardly. The hook portion 101a is inserted in and bonded to an upwardly open groove 132d (similar to the groove 32 of the prior embodiment) of the photovoltaic module 130. In addition, the waterproof color board 100a has a step portion 102a along the top portion thereof, the step portion 102a of which is filled with a filler. The bottom edge of the waterproofing color board 100a bends downwardly, and is fixed in the eaves area.

Figure 12:
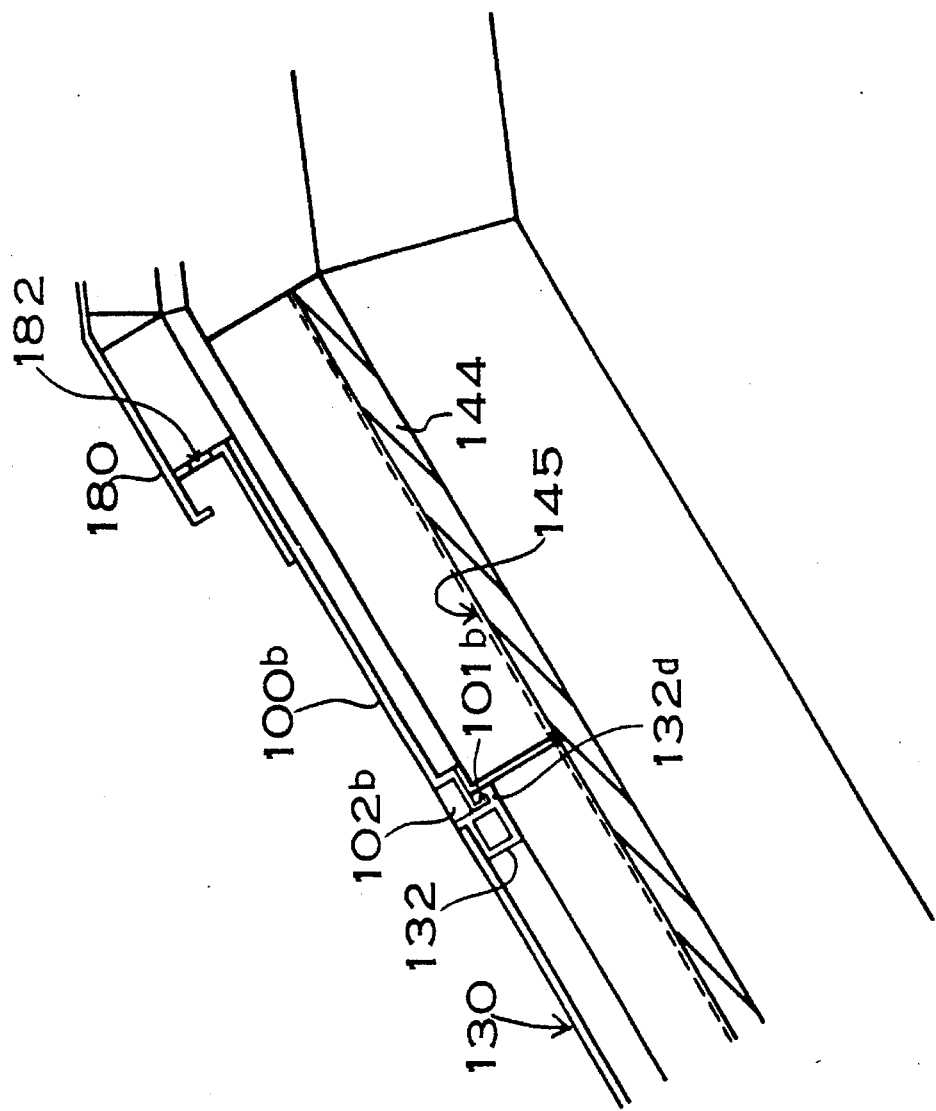
FIG. 12 is a cross-sectional view of the apparatus of FIG. 10 taken along the line D—D of FIG. 10.

FIG. 12 shows a cross section of the waterproofing color board 100b in the ridge area. The waterproofing color board 100b has a hook portion 101b at its bottom edge which bends downwardly. The hook portion 101b is inserted in and bonded to an upwardly open groove 132d of the photovoltaic module 130. In addition, in a similar manner as that of the waterproofing color board 100a in the eaves area, the waterproof color board 100b has a step portion 102b along the bottom portion thereof, the step portion 102b of which is sealingly filled with a filler. The top edge of the waterproofing color board 100b connects to a ridge cover 180 which has a ventilating hole 182. Through the ventilating hole 182, ascending air from under the photovoltaic modules 130 is ventilated.

Figure 13:
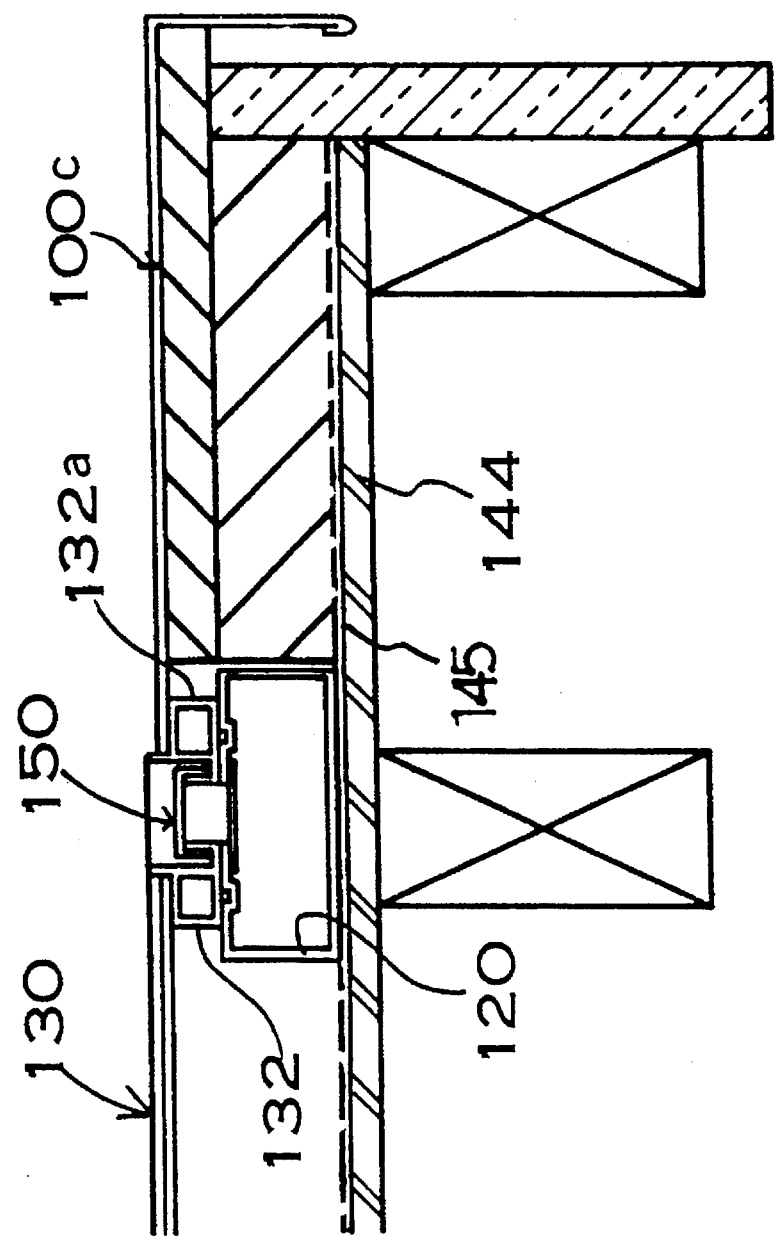
FIG. 13 is a cross-sectional view of the apparatus of FIG. 10 taken along the line E—E of FIG. 10.

FIG. 13 shows a cross section of the waterproofing color board 100c in the verge area. The waterproofing color board 100c is attached sealingly to a straight frame 132a adjacent to the photovoltaic module 130. The straight frame 132a has the same cross-sectional structure as that of the exterior frame structure 132 in the photovoltaic module 130, and is mounted on a lengthwise member 120 similar to the member 20 of the prior embodiment.

The photovoltaic apparatus shown in FIG. 10 is installed in the following manner.

Figure 14:
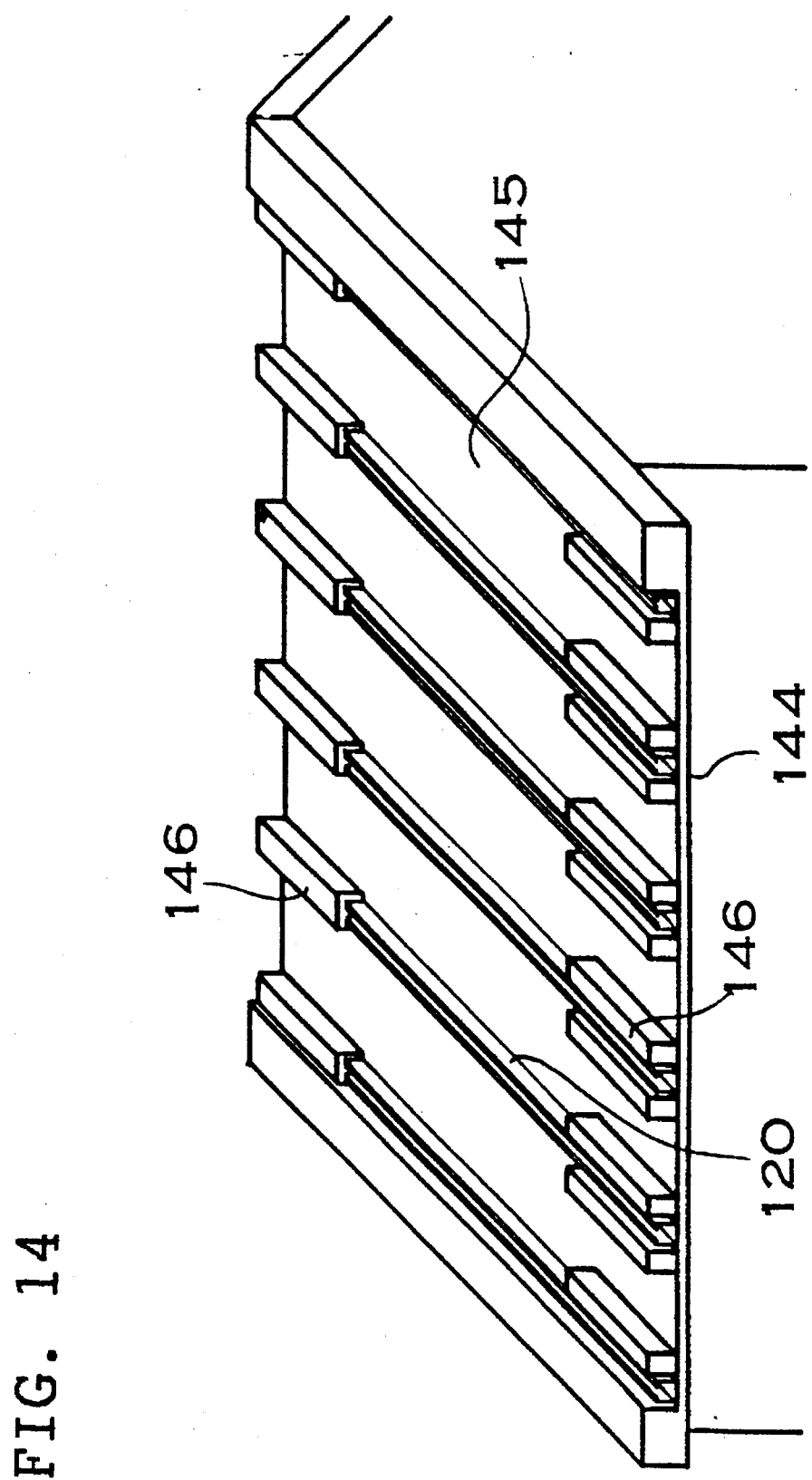
FIG. 14 is a perspective view showing installation of another embodiment of the invention.
Figure 17:
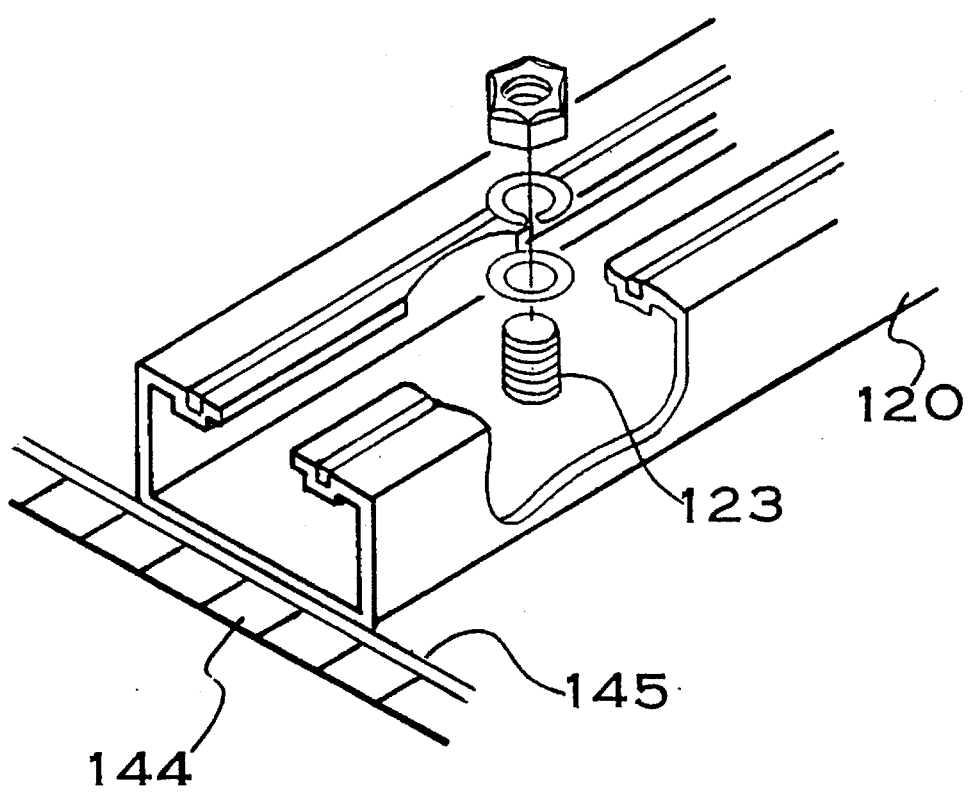
FIG. 17 is a perspective view showing a lengthwise member fixed on a roof.

As shown in FIG. 14, side members 146 and lengthwise members 120 are fixed on a waterproof flexible sheet 145 covering a roof sheathing 144. In the eaves area, the side members 146 are fixed at the upper end of the lengthwise members 120 in order to fix the waterproofing color board 100a. In the ridge area, the side members 146 are fixed on both sides of the lengthwise members 120 in order to fix the waterproofing color board 100b. As shown in FIG. 17, the lengthwise members 120 are fixed by an anchor bolt 123.

Figure 15:
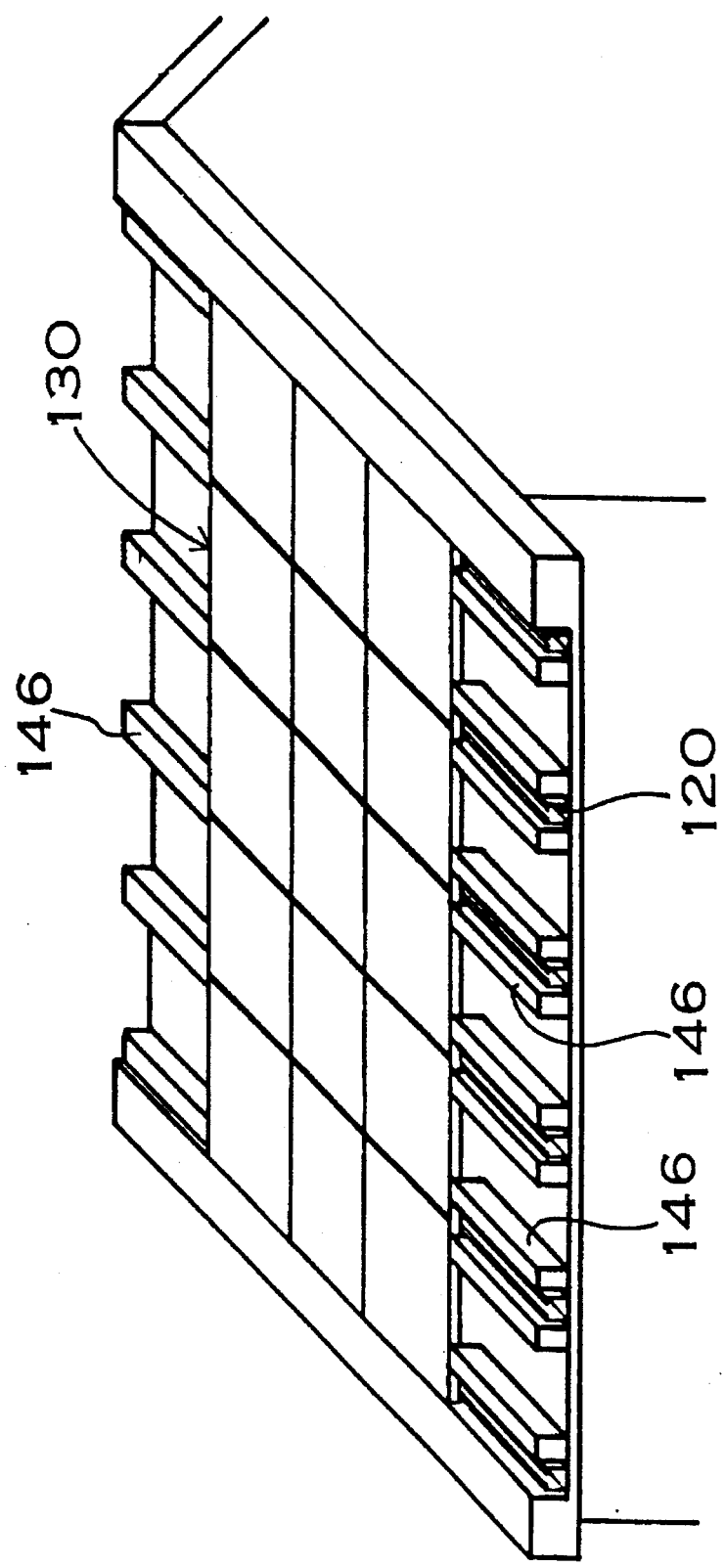
FIG. 15 is a perspective view showing the process of installation of another embodiment of the invention.
Figure 16:
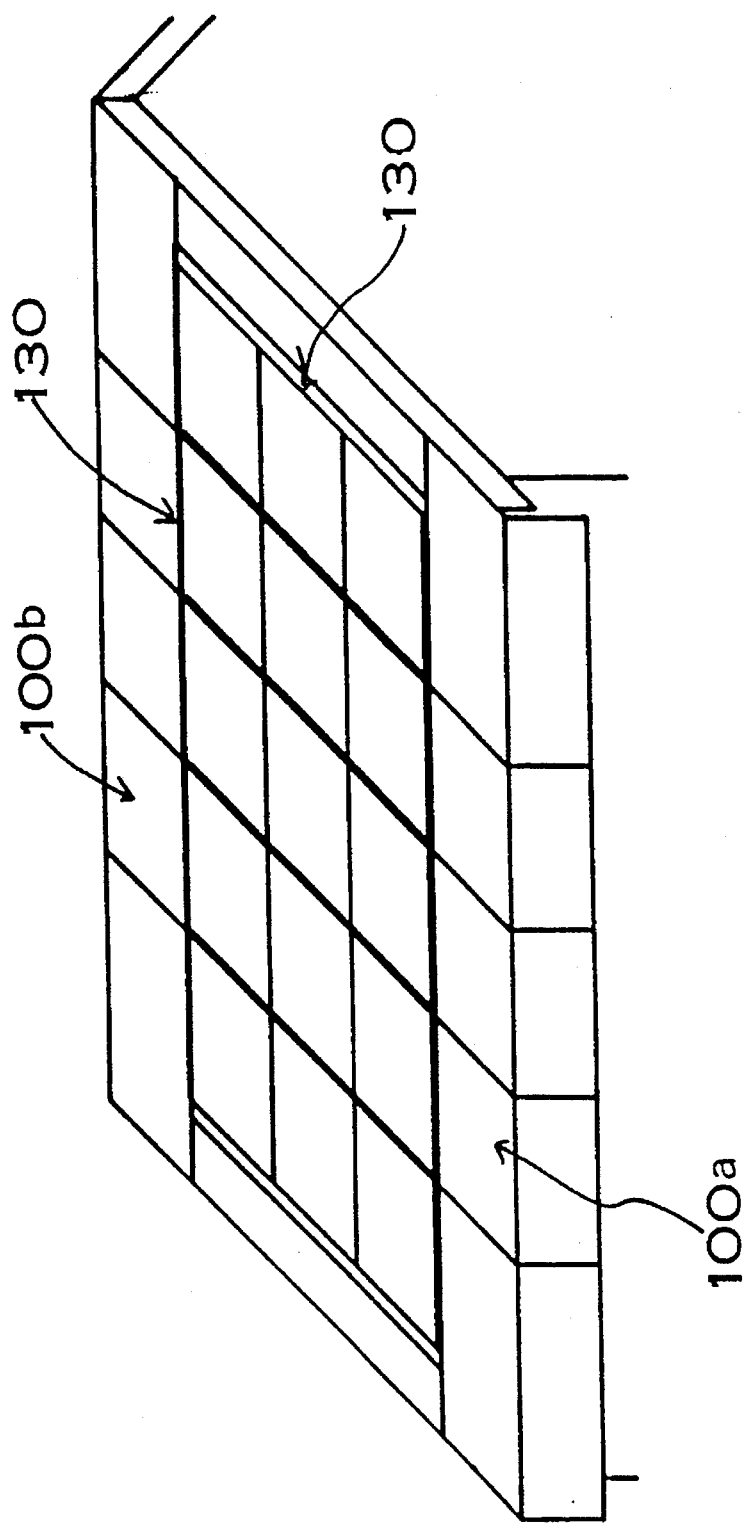
FIG. 16 is a perspective view showing the process of installation of another embodiment of the invention.
Figure 18:
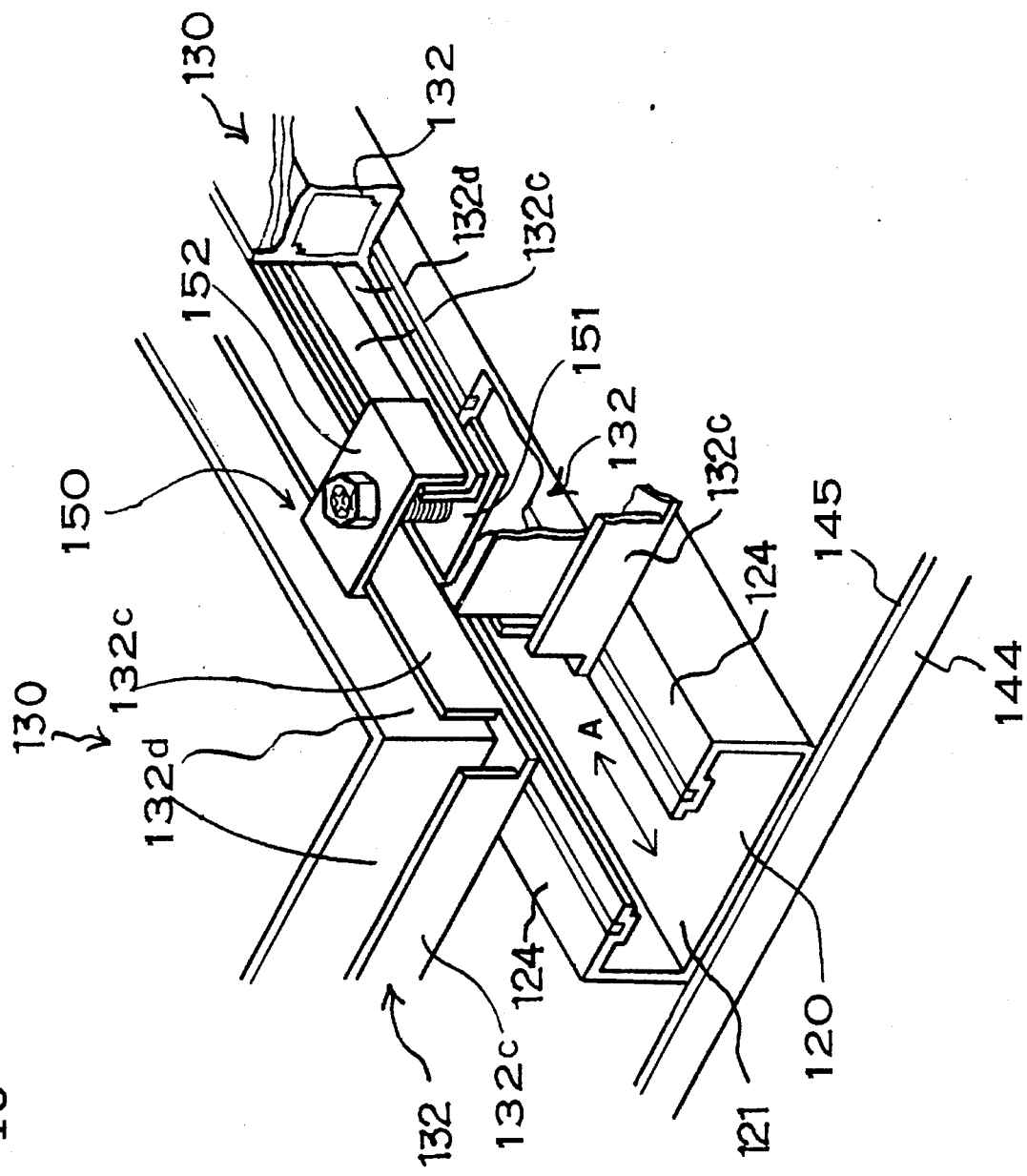
FIG. 18 is a perspective view showing photovoltaic modules fixed on the lengthwise member, partially broken away.

As shown in FIG. 15, the photovoltaic modules 130 are fixed on the lengthwise member 120, and fixed by a metal fixture 150 (similar to the fixture 50 of the prior embodiment) on the lengthwise members 120 as shown in FIG. 18. As described above with reference to FIG. 11, the hook portions 101a in the top edge of the waterproofing color boards 100a are inserted and bonded in the upwardly open grooves 132d. The bottom edges of the waterproofing color boards 100a are fixed by nails and the like in the eaves area. Also, as described above with reference to FIG. 12, the hook portions 101b in the bottom edge of the waterproofing color boards 100b are inserted in the upwardly open grooves 132d, and are bonded. The top edges of the waterproofing color boards 100b are fixed by nails and the like to the roof.

As shown in FIG. 10, the waterproofing color boards 100c are fixed to both sides of the verge areas. As described above with reference to FIG. 13, the inner edges of the waterproofing color boards 100c are sealingly attached to the straight frames 132a adjacent to the photovoltaic modules 130. The outer edges of the waterproofing color boards 100c are fixed by nails and the like to the roof.

As a result, a photovoltaic apparatus having the waterproofing color boards has an improved water-tightness and yet provides a more finished appearance which is pleasing to the eyes. In particular, the peripheral areas of the photovoltaic apparatus have a pleasing appearance, because the waterproof color boards have a similar color or a similar pattern as that of the photovoltaic module. Preferably, each waterproof color board has a similar size as that of a photovoltaic module.

In one embodiment, the photovoltaic apparatus 11 shown in FIG. 5 has the push-in members 60 only between the adjacent photovoltaic modules 30 in the sloped direction. In another embodiment, the photovoltaic apparatus 111 as shown in FIGS. 19–21 has push-in members between the adjacent photovoltaic modules 130 in both the direction of the slope and the direction transverse to the slope.

Figure 19:
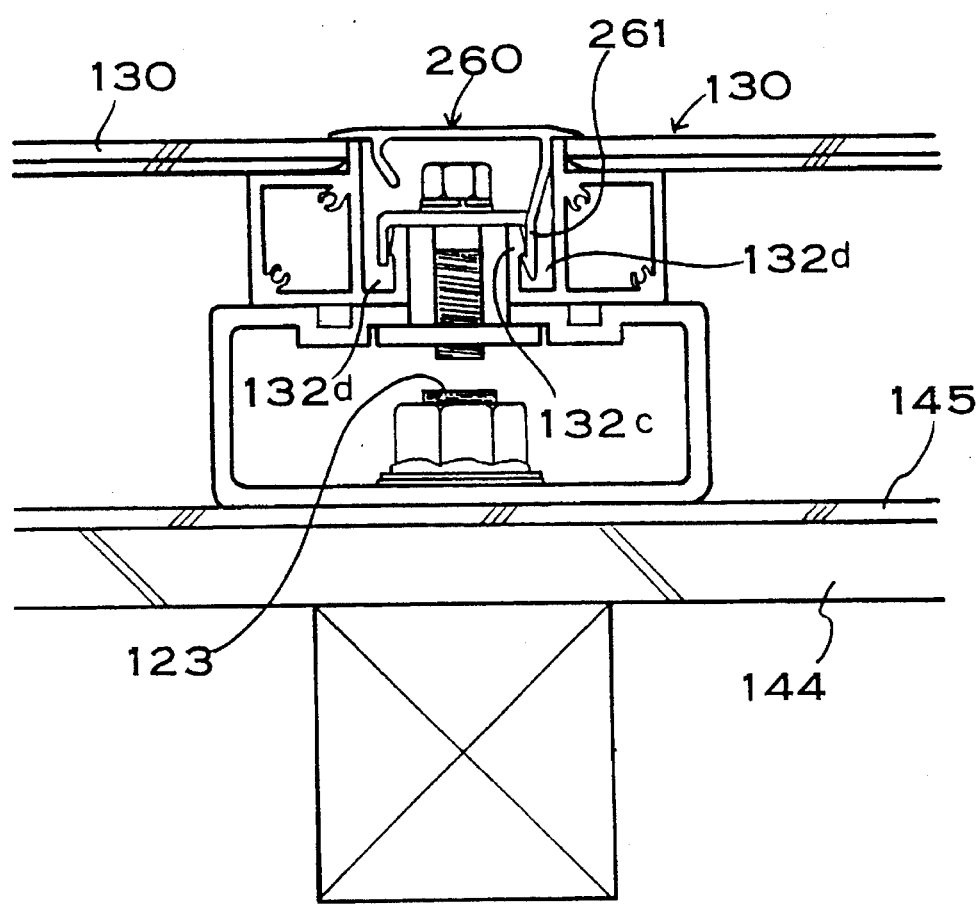
FIG. 19 is a cross-sectional view taken along the line F—F of FIG. 10.

Referring to FIG. 19, a push-in member 260 has an engaging element 261 instead of the sandwiching element 61 of the pushing member 60 shown in FIG. 5, in order to be easily inserted and detached. The engaging member 261 has a hook-shaped portion in the bottom edge thereof. A side flange portion 132c of the frame structure has a hook-shaped portion in the top edge thereof. The engaging member 261 preferably includes at least a portion which is resilient and flexible, so that the hook-shaped portion resiliently engages the hook-shaped portion of the side flange portion 132c. Both hook-shaped portions engage with and detach from each other. The push-in member 260 is readily inserted in and removed from a gap between the adjacent photovoltaic modules 130 arranged in the downhill direction along the slope.

Figure 20:
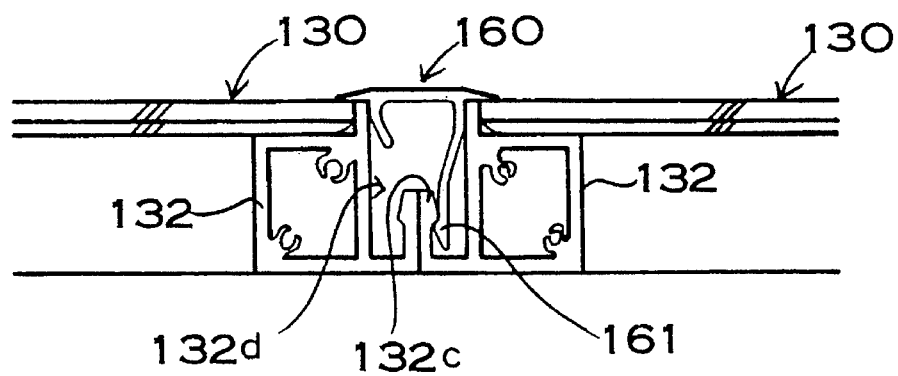
FIG. 20 is a cross-sectional view taken along the line G—G of FIG. 10.
Figure 20:
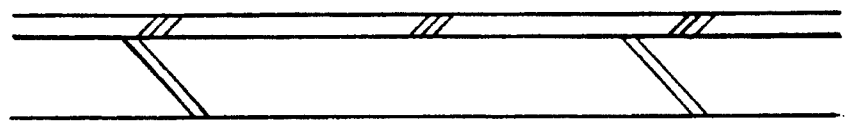
Figure 21:
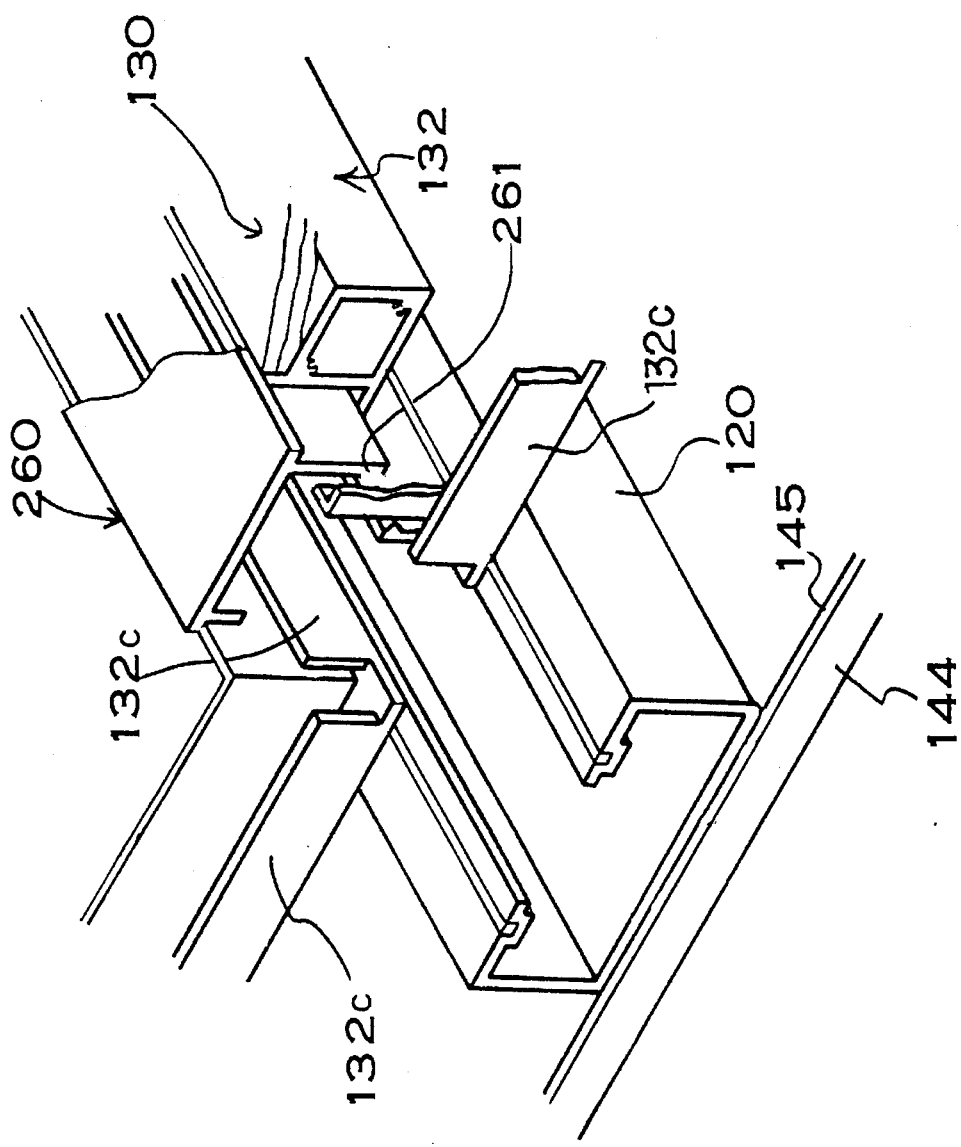
FIG. 21 is a perspective view (partially broken away) showing a pushing member inserted between adjacent photovoltaic modules in the direction of slope.

FIG. 20 shows a push-in member 160 in accordance with another embodiment. The push-in member 160 is inserted in a gap between two adjacent photovoltaic modules 130 arranged in the direction transverse to the slope (parallel to the ridge). In a similar manner as the push-in member 260 shown in FIG. 19, the pushing member 160 has engaging element 161 which has hook-shaped portions at the extreme end portion thereof. The side flange portion 132c of the frame structure also has a hook-shaped portion in the top edge thereof. Both hook-shaped portions engage with each other. The push-in members 160 are readily inserted in and detached from the gap between the adjacent photovoltaic modules 130. The push-in members 160 and 260 shown in FIGS. 19–20, are readily inserted and detached, so a broken photovoltaic module can be readily replaced with a new one.

As shown in FIG. 18, the photovoltaic modules 130 facilitate easy insertion of a metal fixture 150. The exterior frame structures 132 and the lengthwise member 120 are sandwiched by the metal fixture 150.

The metal fixture 150 comprises a strip-shaped member 151 and a U-shaped member 152. The board member 151 is wider than the width of the top opening 121 and engages the interior surfaces of the mounting flanges 124. The U-shaped member 152 has a U-shaped cross section wherein both edges engage the side flange portions 132c. As shown in FIGS. 18 and 21, at the corner areas of the photovoltaic modules 130, side walls of the side flange portions 132c in an L-shaped cross section are cut out. At the four corners of each of the photovoltaic modules, side walls of the side flange portions 132c are cut back. Therefore the U-shaped member 152 is able to slide in the direction shown by an arrow A along an upwardly open groove 132d. In the photovoltaic modules, the metal fixture 150 is inserted from the bottom edge of the lengthwise member 120, and moved upwardly to an appropriate location to fix the photovoltaic modules 130. Accordingly, the photovoltaic modules 130 are installed easily and quickly.

A photovoltaic module in accordance with the illustrated embodiment has upwardly open grooves along the top edge and the bottom edge. When the photovoltaic modules are mounted along the direction of the slope on the sloped surface, rain water flows down in the direction of the slope. Then, rain water flows into the upwardly open grooves along the top edge and the bottom edge. As a result, rain water does not directly reach the roof sheathing.

Also, in accordance with an embodiment of this invention, the photovoltaic panels do not have to be partially overlapped with each other to prevent rain water from leaking between the panels, because rain water falls into the upwardly open grooves along the top edge and the bottom edge, and does not reach the roof sheathing.

In a photovoltaic apparatus in accordance with another embodiment of the invention, the exterior frame structures of the two adjacent photovoltaic modules are mounted on mounting flanges of the lengthwise member. As a result, the photovoltaic modules do not have to be partially overlapped with each other to prevent rain water from leaking therebetween. Accordingly, when a photovoltaic module is broken, it can be readily replaced with a new one.

In addition, since rain water flows down in the groove of the lengthwise member and the upwardly open grooves, rain water does not reach the roof sheathing. As a result, preventing rain water from reaching the roof sheathing improves the weather resistance of the photovoltaic apparatus including the roof sheathing.

It will, of course, be understood that modifications of the present invention, in its various aspects will be apparent to those skilled in the art, some being apparent only after study and others being matters of routine mechanical design. As such, the scope of the invention should not be limited by the particular embodiment herein described but should be defined only by the appended claims and equivalent thereof.

What is claimed:

1. A photovoltaic module comprising:

photovoltaic panel having atop edge and a bottom edge;

an exterior frame structure attached to the top and bottom edges of the photovoltaic panel, the exterior frame structure including an upwardly open groove extending along each of the top and bottom edges for channeling rain water.

2. A photovoltaic module according to claim 1, wherein the frame structure has side edges which each also define an upwardly open groove.

3. A photovoltaic apparatus for mounting on a sloped surface, said photovoltaic apparatus comprising:

at least one lengthwise member adapted to be mounted on the sloped surface in the direction of the slope of the sloped surface, the lengthwise member having a top open groove and a mounting flange on one side of the top open groove; and at least two adjacent photovoltaic modules adapted to be placed on the lengthwise member along the direction of the slope of the sloped surface, each of the photovoltaic modules including a sheet-shaped photovoltaic panel having a top edge, a bottom edge and side edges, and an exterior frame structure attached to the top edge, bottom edge and side edges of the photovoltaic panel, the exterior frame structure including an upwardly open groove extending at least along each of the top edge and the bottom edge and projecting outwardly from each of the top edge and the bottom edge, the upwardly open grooves of the frame structure fluidically communicating with the top open groove of the lengthwise member; and the side edges of the exterior frame structures of two adjacent photovoltaic modules being mounted on the mounting flange of the lengthwise member.

4. A photovoltaic apparatus according to claim 3, wherein the exterior frame structure attached at each of the side edges includes an upwardly open groove extending along each of the side edges, and projects outwardly from each of the side edges.

5. A photovoltaic apparatus according to claim 4, wherein the photovoltaic module has four corners defined by the top edge, the bottom edge and the side edges, and the upwardly open grooves have side walls, the side walls having openings at least one of the corners.

6. A photovoltaic apparatus according to claim 3, wherein the lengthwise member has a rectangular cross section, having an upper surface, and has a top opening and the mounting flange on the one side of the top opening on the upper surface thereof, the top open groove being formed inside the lengthwise member and being open at the top opening.

7. A photovoltaic apparatus according to claim 6, further comprising a metal fixture for fixing the photovoltaic modules to the lengthwise member, and wherein the metal fixture comprises:

a strip-shaped member wider than the width of the top opening for engaging the mounting flange;

a generally U-shaped member, the U-shaped member having edges for engaging the upwardly open grooves of the exterior frame structure; and means for fixing the strip-shaped member and the U-shaped member to each other.

8. A photovoltaic apparatus according to claim 3, wherein the side edge at least one end of each of the upwardly open grooves in the top edge and the bottom edge of a photovoltaic module is open.

9. A photovoltaic apparatus according to claim 3, further comprising a plurality of boards wherein the at least two adjacent photovoltaic modules define a pattern and the boards have a similar pattern.

10. A photovoltaic apparatus according to claim 3, further comprising a plurality of boards wherein the at least two adjacent photovoltaic modules and the boards have a similar color.

11. A photovoltaic apparatus according to claim 3, further comprising a plurality of boards wherein the at least two adjacent photovoltaic modules and the boards each have a similar size.

12. A photovoltaic apparatus according to claim 3, further comprising a cover for covering a joint area between the two adjacent photovoltaic modules to substantially prevent rain water from flowing into the joint area.

13. A photovoltaic apparatus according to claim 12, wherein at least one of the exterior frame structures facing another exterior frame structure includes a first hook member, and the cover includes a second hook member for detachably engaging the first hook member.

14. A photovoltaic apparatus according to claim 13, wherein at least one of the first hook member and the second hook member is made of a resilient material.

15. A photovoltaic apparatus according to claim 13, wherein the first hook member is provided inside the upwardly open groove of at least one of the exterior frame structures facing another exterior frame structure.

16. A photovoltaic apparatus for mounting on a sloped surface, the photovoltaic apparatus comprising:

at least one lengthwise member for mounting on the sloped surface in the direction of the slope, the at least one lengthwise member having a first top open groove and two mounting flanges on both sides of the first top open groove;

at least two adjacent frame members disposed on the two mounting flanges of the at least one lengthwise member, each of said at least two adjacent frame members including a second top open groove; and a photovoltaic panel attached to each of the at least two adjacent frame members.

17. A photovoltaic apparatus according to claim 16, wherein the photovoltaic panel defines an upper edge and a lower edge, said apparatus further including an upper frame member extending along the upper edge of the panel and a lower frame member extending along the lower edge of the panel, each of the upper frame member and the lower frame member including an upwardly open groove fluidically communicating with the first top open groove of the at least one lengthwise member.

* * * * *